United States Patent
Sadjadi et al.

(10) Patent No.: US 7,977,242 B2
(45) Date of Patent: Jul. 12, 2011

(54) DOUBLE MASK SELF-ALIGNED DOUBLE PATTERNING TECHNOLOGY (SADPT) PROCESS

(75) Inventors: S. M. Reza Sadjadi, Saratoga, CA (US); Lumin Li, Santa Clara, CA (US); Andrew R. Romano, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 227 days.

(21) Appl. No.: 12/366,113

(22) Filed: Feb. 5, 2009

(65) Prior Publication Data

US 2009/0215272 A1 Aug. 27, 2009

Related U.S. Application Data

(60) Provisional application No. 61/027,299, filed on Feb. 8, 2008.

(51) Int. Cl.
*H01L 21/461* (2006.01)
*H01L 21/311* (2006.01)
(52) U.S. Cl. ........................ 438/694; 438/703
(58) Field of Classification Search .................. 438/694, 438/703; 257/E21.323
See application file for complete search history.

(56) References Cited

U.S. PATENT DOCUMENTS

| | | | |
|---|---|---|---|
| 6,225,154 B1 * | 5/2001 | Allman | 438/231 |
| 7,074,723 B2 * | 7/2006 | Chinn et al. | 438/714 |
| 7,241,683 B2 | 7/2007 | Hudson et al. | |
| 2006/0216938 A1 | 9/2006 | Miyagawa et al. | |
| 2007/0148968 A1 | 6/2007 | Kwon et al. | |
| 2007/0264828 A1 | 11/2007 | Jung | |

OTHER PUBLICATIONS

International Search Report dated Aug. 27, 2009 from International application No. PCT/US2009/031713.
Written Opinion dated Aug. 27, 2009 from International application No. PCT/US2009/031713.

* cited by examiner

*Primary Examiner* — William M. Brewster
(74) *Attorney, Agent, or Firm* — Beyer Law Group LLP

(57) ABSTRACT

A method for providing features in an etch layer is provided by forming an organic mask layer over the inorganic mask layer, forming a silicon-containing mask layer over the organic mask layer, forming a patterned mask layer over the silicon-containing mask layer, etching the silicon-containing mask layer through the patterned mask, depositing a polymer over the etched silicon-containing mask layer, depositing a silicon-containing film over the polymer, planarizing the silicon-containing film, selectively removing the polymer leaving the silicon-containing film, etching the organic layer, and etching the inorganic layer.

18 Claims, 16 Drawing Sheets

DOUBLE MASK SELF-ALIGNED DOUBLE PATTERNING TECHNOLOGY (SADPT) PROCESS

CROSS REFERENCE TO RELATED APPLICATIONS

This application claims priority under 35 U.S.C. §19(e) to U.S. Provisional Patent Application No. 61/027,299 filed on Feb. 8, 2008, entitled "DOUBLE MASK SELF-ALIGNED DOUBLE PATTERNING TECHNOLOGY (SADPT) PROCESS", which is incorporated by reference in its entirety for all purposes.

BACKGROUND OF THE INVENTION

The present invention relates to the formation of semiconductor devices.

During semiconductor wafer processing, features of the semiconductor device are defined in the wafer using well-known patterning and etching processes. In these processes, a photoresist (PR) material is deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

Various generations of photoresist are known. The photoresist patterns have a critical dimension (CD), which may be the width of the smallest feature. The CD uniformity in ultra large scale integrated circuits (ULSI) is a crucial parameter for high performance devices. The CD uniformity in the gate electrode, for example, affects the threshold voltage distribution and the overall yield of the devices. As the design rules of ULSI reduced, the roughness of the edges of the lines (Line Width Roughness: LWR) of linear features patterned by photolithography becomes worse. The LWR is a measure of how smooth the edge of a linear feature is when viewed from the top down. The ideal feature has an edge that is "straight like a ruler". However, for various reasons the line feature may sometimes instead appear jagged. Jagged lines (i.e., with a high LWR) are generally very undesirable because the CD measured along the liner feature would vary from position to position, rendering operation of the resulting device unreliable.

SUMMARY OF THE INVENTION

To achieve the foregoing, a method for patterning features over an etch layer comprises forming an organic mask layer over the inorganic mask layer, forming a silicon-containing mask layer over the organic mask layer, forming a patterned mask layer over the silicon-containing mask layer, etching the silicon-containing mask layer through the patterned mask, depositing a polymer over the etched silicon-containing mask layer, depositing a silicon-containing film over the polymer, planarizing the silicon-containing film, selectively removing the polymer leaving the silicon-containing film, etching the organic layer, and etching the inorganic layer.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
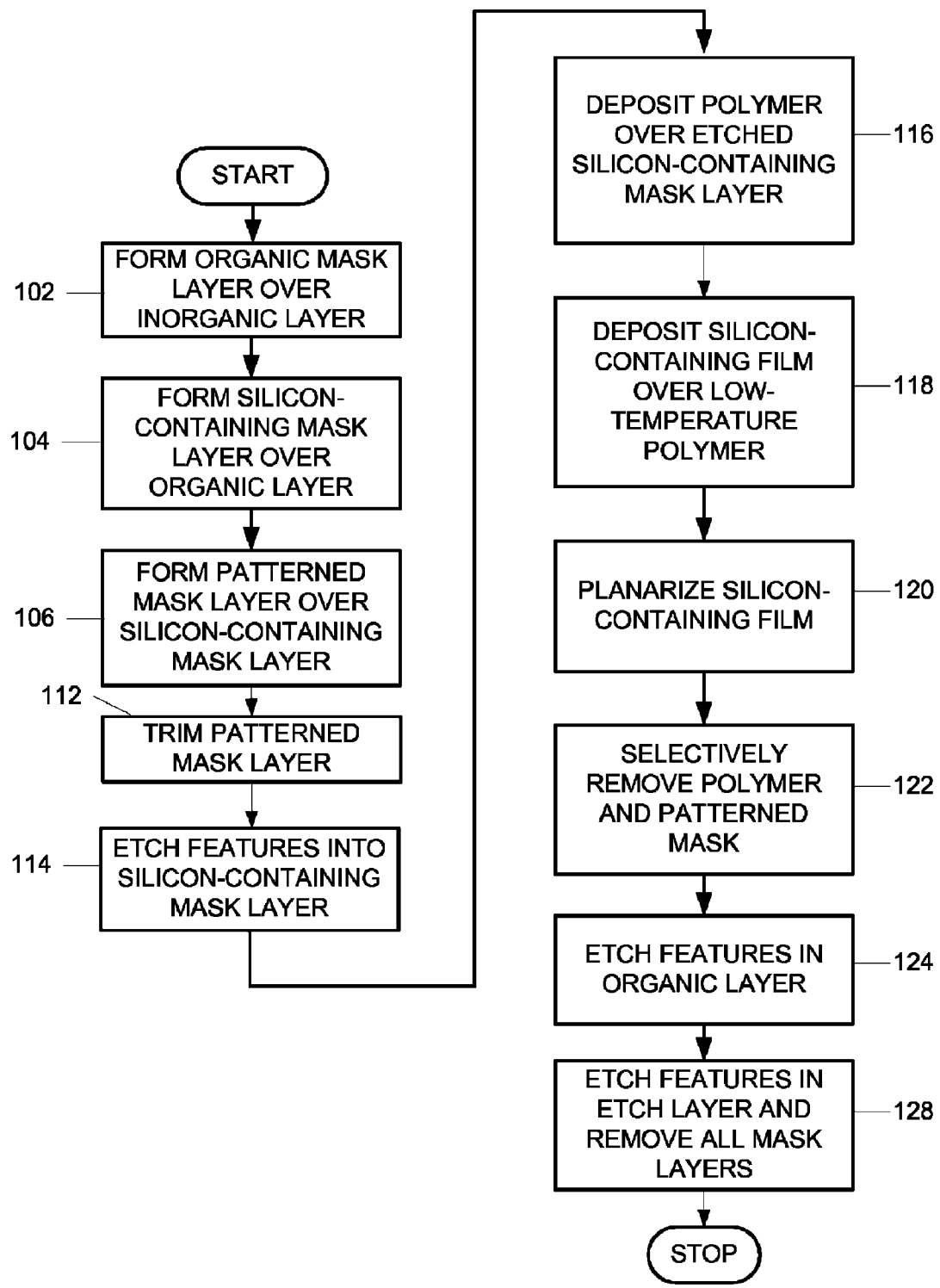
FIG. 1 is a flow chart of a process that may be used in an embodiment of the invention.
Figure 2A:
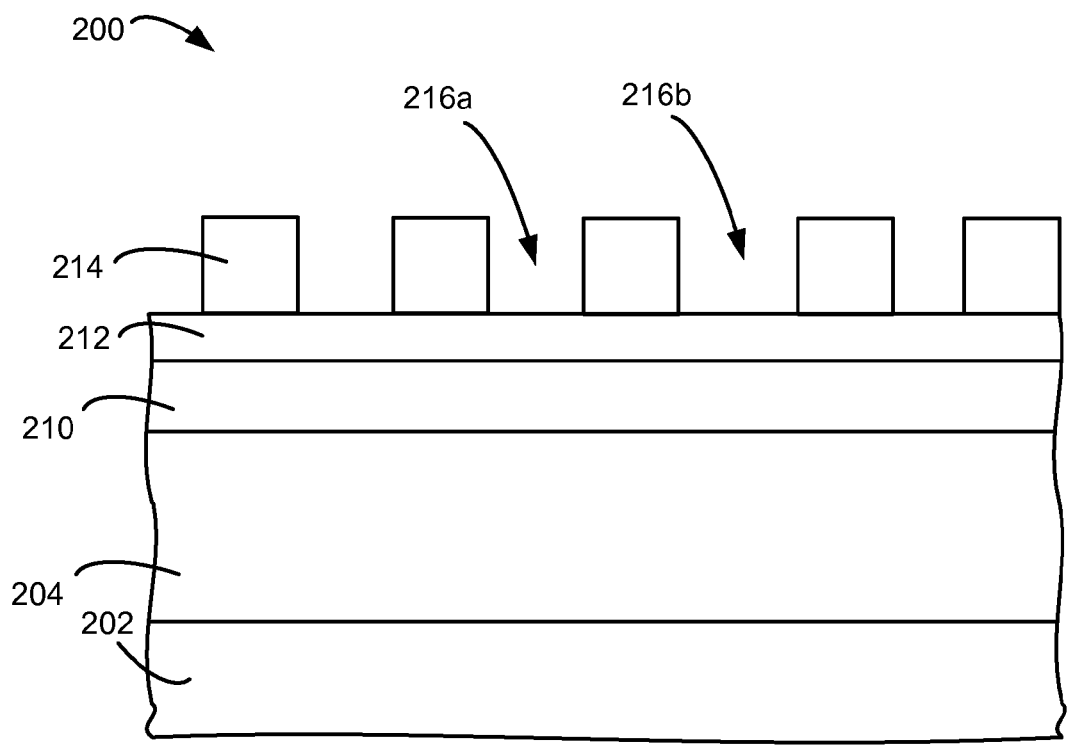
FIGS. 2A-I are schematic cross-sectional and top views of a stack processed according to an embodiment of the invention.

To facilitate understanding, FIG. 1 is a flow chart of a process that may be used in an embodiment of the invention. An organic mask layer may be formed over the inorganic layer (step 102), a silicon-containing mask layer may be formed over the organic layer (step 104), and a patterned mask layer may be formed over the silicon-containing mask layer (step 106). FIG. 2A is a cross-sectional view of an etch layer 204 formed over a substrate 202, an organic mask layer 210 formed over the etch layer 204, a silicon-containing mask layer 212 formed over the organic mask layer 210, and a patterned mask layer 214 formed over the silicon-containing mask layer 212, thereby forming a stack 200.

Figure 7A:
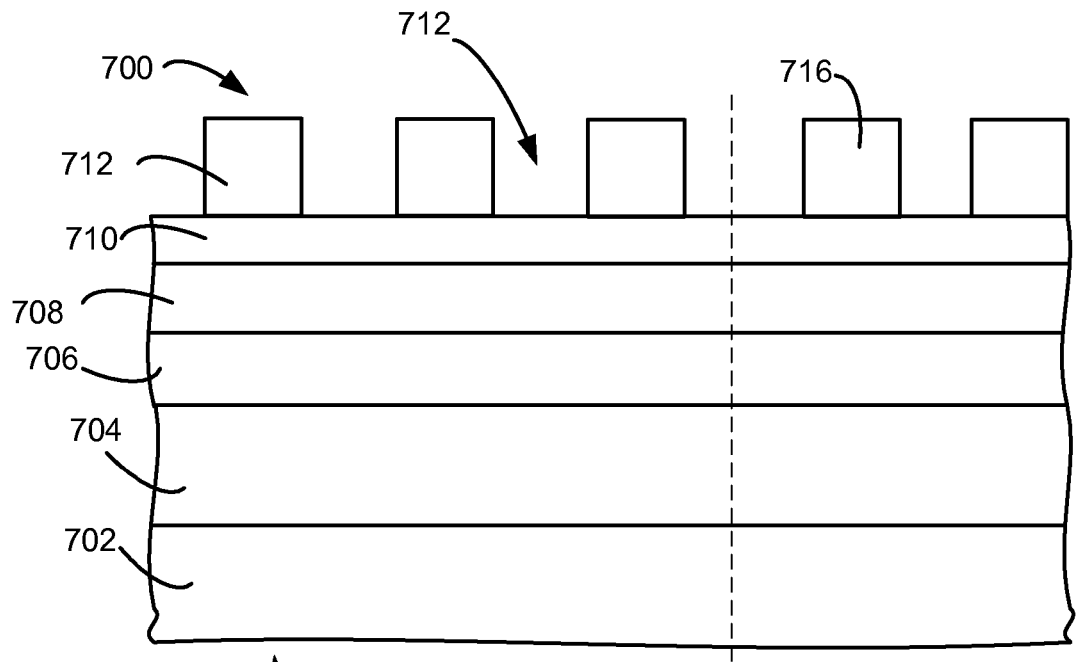
FIGS. 7A-L are schematic cross-sectional and top views of a stack processed according to the embodiment of FIG. 6.

The substrate 202 may be any known substrate such as a silicon wafer. The etch layer 204 may be a dielectric material, such as $SiO_2$, SiN or SiON, which may form a hard mask for etching of a conductor material such as Si. Although not illustrated, an inorganic mask layer may be formed over the etch layer 204 as illustrated in FIG. 7A. The organic mask layer 210 may be any organic hard mask material, such as amorphous carbon. In one example, the organic mask layer may be a 300 nm amorphous carbon.

The silicon-containing mask layer 212 may be any spin on glass (SOG) material such as a known silicon oxide or Si containing polymers. In one example, the silicon-containing mask layer 212 may be a 30 nm SOG material. The silicon-containing mask layer 212 may also have an anti-reflective coating (ARC) layer (not shown) formed over the silicon-containing mask layer 212. Typically, in photolithography steps, one or more ARC layers, for example, a bottom anti-reflective coating (BARC) and/or a dielectric antireflective coating (DARC) layer are provided under the patterned mask. These layers minimize or eliminate reflections during exposure of the patterned mask which may produce standing waves. Such standing waves may result in defects such as sinusoidal "scalloping" of the patterned mask sidewalls, or the formation of "feet" at the base of the patterned mask layer. Therefore, BARC/DARC layers are generally disposed below the patterned mask layer and above other device materials (e.g. SiO2) to be etched through the patterned mask. BARC/DARC layers may be organic-based or inorganic-based, and are usually composed of different materials than the underlying dielectric material. For example, an inorganic BARC layer may be composed of titanium nitride (TiN) as well as silicon oxynitride (SiON).

A patterned mask 214 may be formed over the silicon-containing mask layer 212. Preferably, the patterned mask 214 is of a photoresist material. For example, the mask may be a 60 nm photoresist material. The substrate 202 may be placed in a processing chamber.

Figure 4:
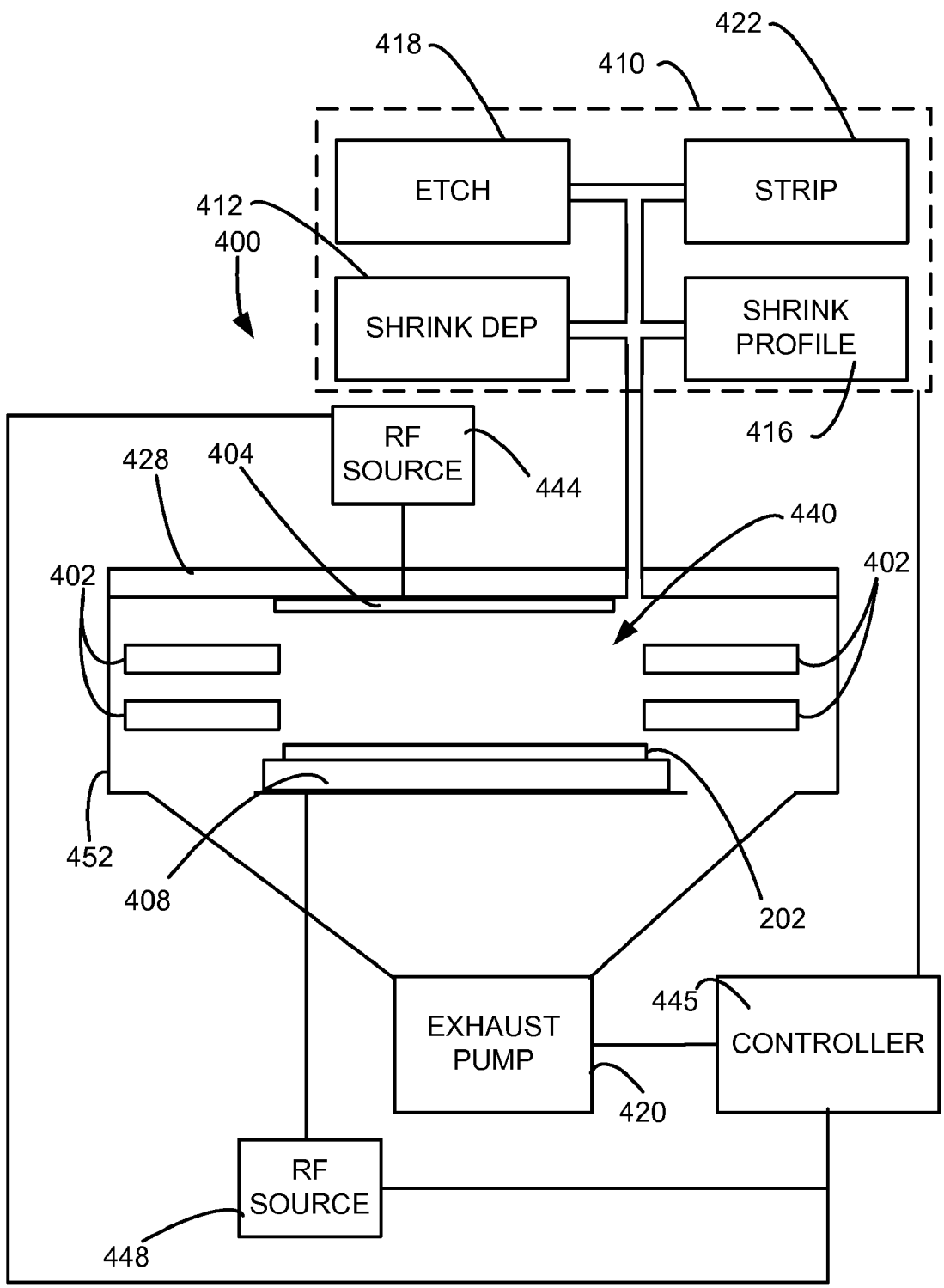
FIG. 4 is a schematic view of a plasma processing chamber that may be used in practicing the invention.

FIG. 4 is a schematic view of a processing chamber 400 that may be used in this embodiment. The plasma processing chamber 400 comprises confinement rings 402, an upper electrode 404, a lower electrode 408, a gas source 410, and an exhaust pump 420. The gas source 410 comprises a shrink deposition gas source 412 and a shrink profile gas source 416. The gas source may comprise additional gas sources such as an etch gas source 418 and a stripping gas source 422 to allow etching, stripping, and other processes to be performed in the same chamber. Within plasma processing chamber 400, the substrate 202 is positioned upon the lower electrode 408. The lower electrode 408 incorporates a suitable substrate chucking mechanism (e.g., electrostatic, mechanical clamping, or the like) for holding the substrate 202. The reactor top 428 incorporates the upper electrode 404 disposed immediately opposite the lower electrode 408. The upper electrode 404, lower electrode 408, and confinement rings 402 define the confined plasma volume 440. Gas is supplied to the confined plasma volume by the gas source 410 and is exhausted from the confined plasma volume through the confinement rings 402 and an exhaust port by the exhaust pump 420. A first RF source 444 is electrically connected to the upper electrode 404. A second RF source 448 is electrically connected to the lower electrode 408. Chamber walls 452 surround the confinement rings 402, the upper electrode 404, and the lower electrode 408. Both the first RF source 444 and the second RF source 448 may comprise a 60 MHz and/or 27 MHz power source and a 2 MHz power source. Different combinations of connecting RF power to the electrode are possible. In the case of Lam Research Corporation's Dual Frequency Capacitive (DFC) System, made by LAM Research Corporation™ of Fremont, Calif., which may be used in a preferred embodiment of the invention, both the 27 MHz and 2 MHz power sources make up the second RF power source 448 connected to the lower electrode, and the upper electrode is grounded. In other embodiments, the RF power source may have a frequency up to 300 MHz. A controller 445 is controllably connected to the RF sources 444, 448, exhaust pump 420, and the gas source 410. The DFC System would be used when the layer to be etched 204 is a dielectric layer, such as silicon oxide or organo silicate glass.

Figure 5A:
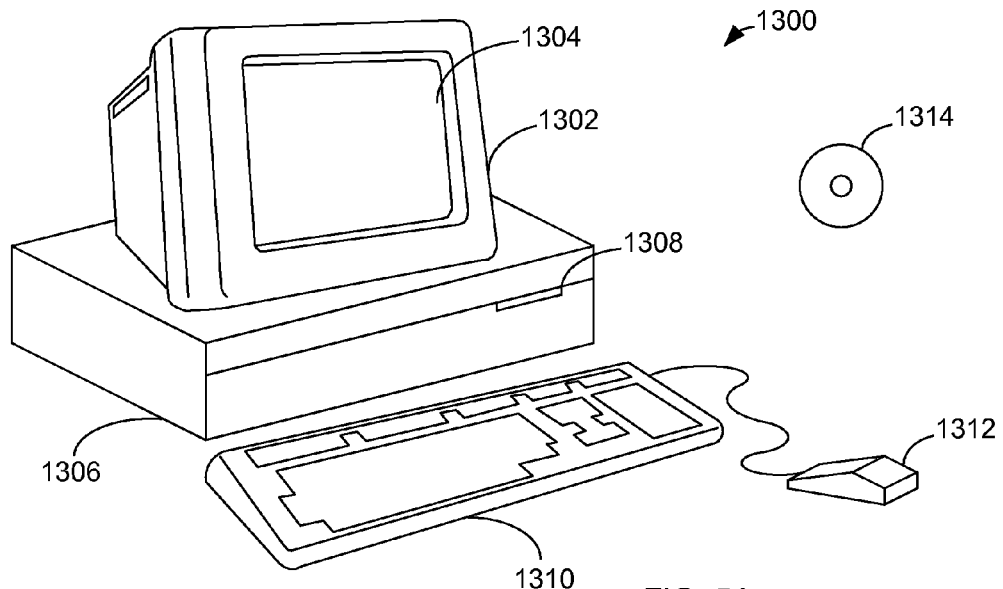
FIGS. 5A-B illustrate a computer system, which is suitable for implementing a controller used in embodiments of the present invention.
Figure 5B:
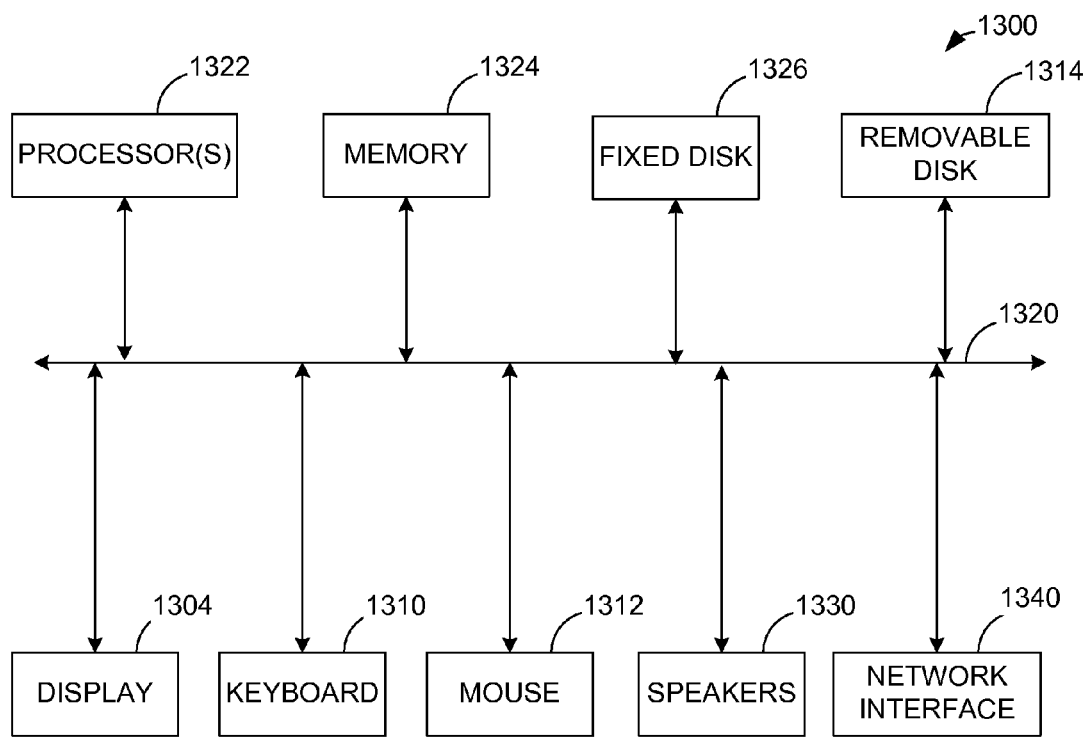

FIGS. 5A and 5B illustrate a computer system 1300, which is suitable for implementing a controller 445 used in embodiments of the present invention. FIG. 5A shows one possible physical form of the computer system. Of course, the computer system may have many physical forms ranging from an integrated circuit, a printed circuit board, and a small hand-held device up to a huge super computer. Computer system 1300 includes a monitor 1302, a display 1304, a housing 1306, a disk drive 1308, a keyboard 1310, and a mouse 1312. Disk 1314 is a computer-readable medium used to transfer data to and from computer system 1300.

FIG. 5B is an example of a block diagram for computer system 1300. Attached to system bus 1320 is a wide variety of subsystems. Processor(s) 1322 (also referred to as central processing units, or CPUs) are coupled to storage devices, including memory 1324. Memory 1324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1326 is also coupled bi-directionally to CPU 1322; it provides additional data storage capacity and may also include any of the computer-readable media described below. Fixed disk 1326 may be used to store programs, data, and the like and is typically a secondary storage medium (such as a hard disk) that is slower than primary storage. It will be appreciated that the information retained within fixed disk 1326 may, in appropriate cases, be incorporated in standard fashion as virtual memory in memory 1324. Removable disk 1314 may take the form of any of the computer-readable media described below.

CPU 1322 is also coupled to a variety of input/output devices, such as display 1304, keyboard 1310, mouse 1312, and speakers 1330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1322 optionally may be coupled to another computer or telecommunications network using network interface 1340. With such a network interface, it is contemplated that the CPU might receive information from the network, or might output information to the network in the course of performing the above-described method steps. Furthermore, method embodiments of the present invention may execute solely upon CPU 1322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of tangible computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
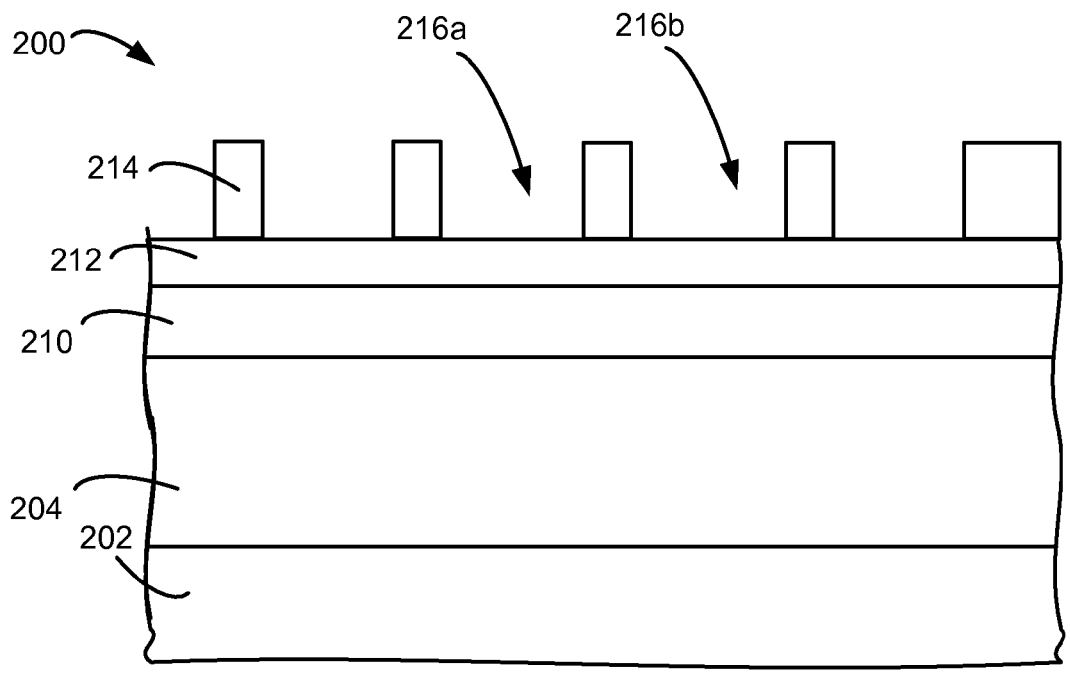

Referring back to FIG. 1, the patterned mask layer may be trimmed (step 112). This is illustrated in FIG. 2B, in that the structures of the patterned mask 214 are laterally etched to be made thinner. In other words, the features 216a, 216b are made wider. The trim time is adjusted such that a polymer layer and silicon-containing layer may be placed at desired positions. An example recipe for trimming the mask layer is an $O_2$-based photoresist trim process with a pressure of 400 mTorr. 200 watts are provided at a frequency of 27 MHz. 100 sccm of $O_2$ is provided.

Figure 2C:
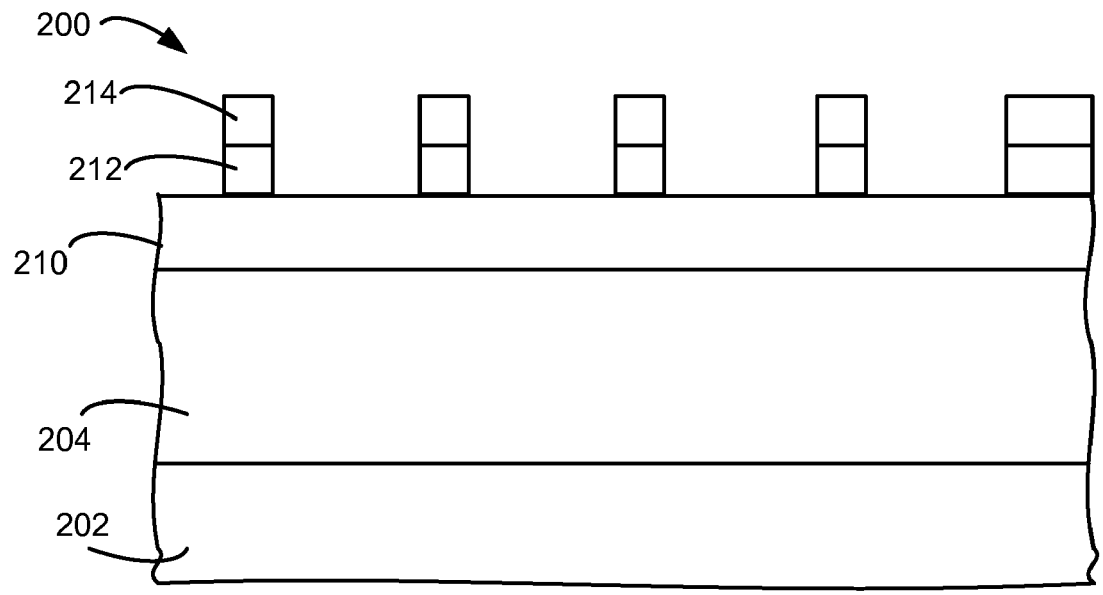

The features are then etched into the silicon-containing mask layer (step 114) through the patterned mask layer, as shown in FIG. 2C. An example of a recipe for etching a silicon-containing mask layer, such as a SOG, provides a pressure of 40 mTorr. 300 watts are provided at a frequency of 27 MHz. 100 sccm of $CF_4$ are provided.

Figure 2D:
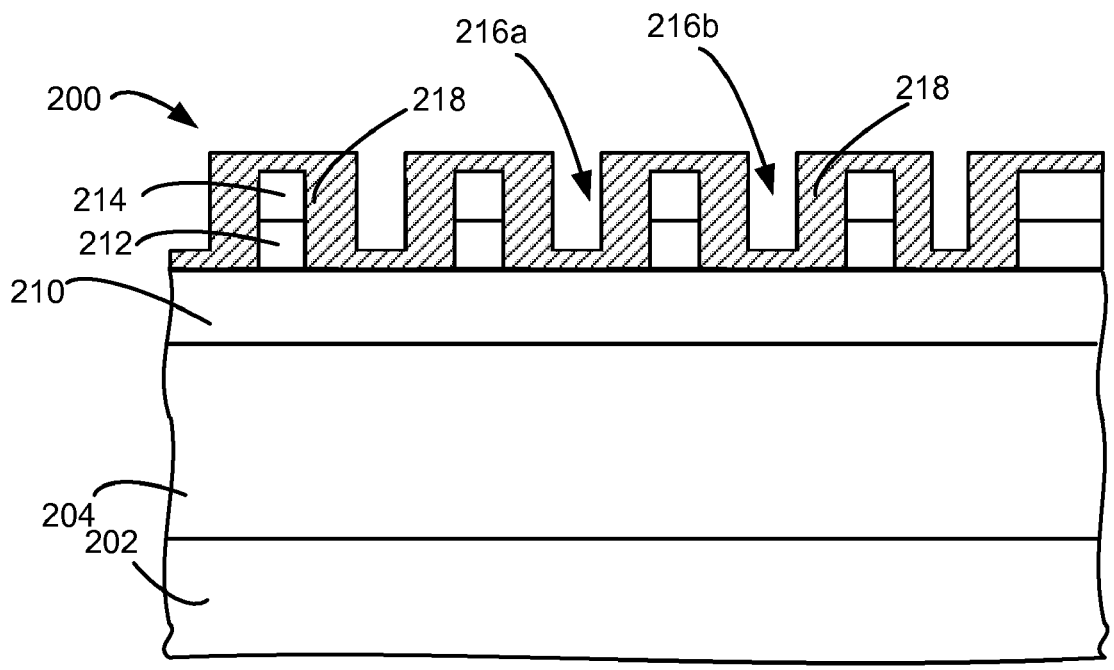

A polymer may be deposited over the silicon-containing mask layer (step 116). As illustrated in FIG. 2D, the polymer 218 deposition time may be adjusted such that the features 216a, 216b are not completely filled with the polymer 218. In an alternative embodiment, the polymer 218 may only be deposited on the sidewalls of the silicon-containing mask layer 212 and the patterned mask layer 214 and not on the bottom of the features 216a, 216b. Furthermore, although illustrated with the polymer deposited on the top of the patterned mask layer 214, deposition on the top is not necessary.

The polymer 218 may be any low temperature polymer, such as hydro-fluorocarbons or hydrocarbons, that may be conformally deposited using gas modulation (providing a deposition phase and a profile shaping phase) and that allows selective removal of the polymer without removing or damaging the sidewalls of the silicon-containing mask layer 212 as well as a silicon-containing film, as further discussed below with reference to FIG. 2G. The use of gas modulation to deposit the polymer allows the deposition to occur at a temperature less than 100° C., which reduces device damage, thermal budget, and uses less heat. Furthermore, the use of the low temperature polymer will maintain a low thermal budget for device manufacturing.

Figure 3:
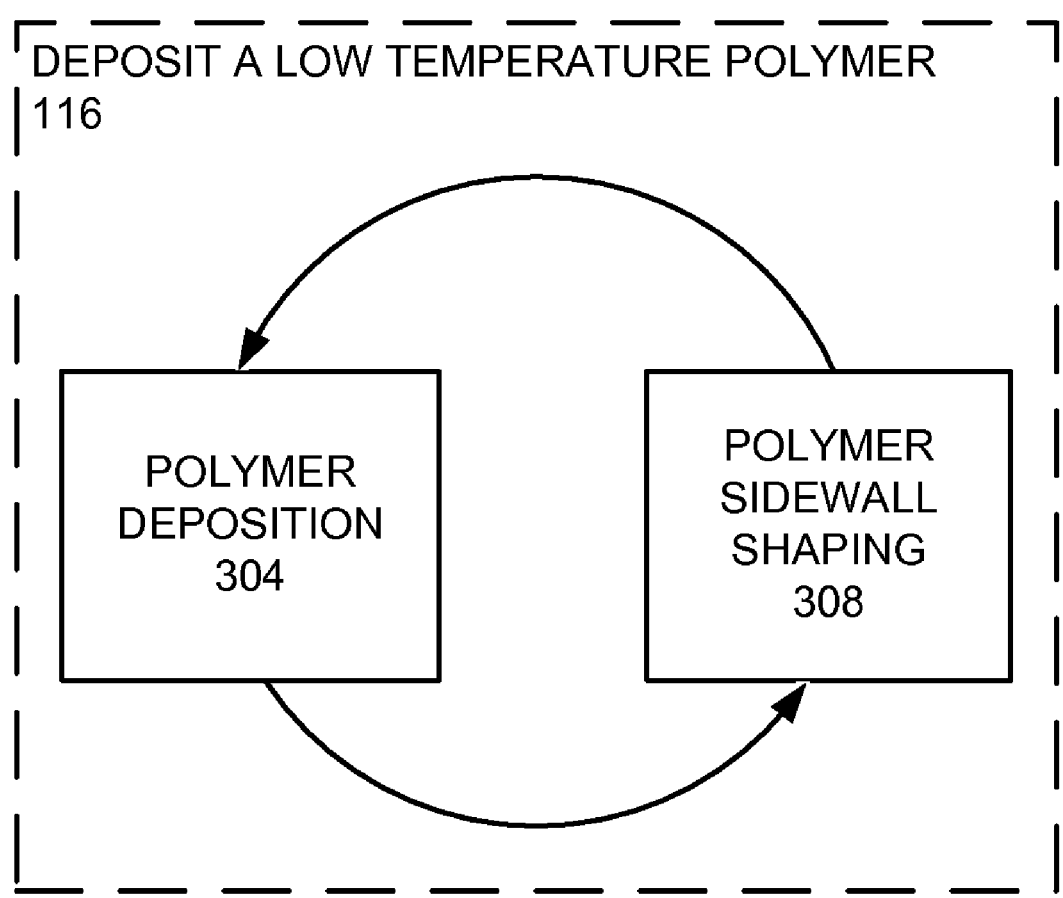
FIG. 3 is a more detailed flow of a step of depositing a polymer.

FIG. 3 is a more detailed flow chart of the step of depositing the polymer (step 116). As shown in FIG. 3, the polymer deposition comprises a plurality of cycles of a cyclic process comprising a polymer deposition phase (step 304) and polymer sidewall shaping phase (step 308).

Preferably, the polymer deposition phase (step 304) uses a deposition gas comprising at least one of $C_xH_y$ or $C_xH_yF_z$, and carrier gases such as He, Ar, Ne, Kr, Xe etc. More preferably, the deposition gas further comprises a carrier gas, such as argon or xenon. More preferably, the deposition gas further comprises at least one of an oxidizing additive and a reducing additive, such as $O_2$, $N_2$, $H_2$, or $NH_3$.

An example of a polymer deposition phase (step 304) provides a flow of 100 sccm $C_2H_4$, and 100 sccm Ar. The pressure is set to 40 mTorr. The substrate is maintained at a temperature of 20° C. The second RF source 448 provides 400 Watts at a frequency of 27 MHz and 0 Watts at a frequency of 2 MHz. During the deposition phase the deposition gas is provided, the deposition gas is transformed into a plasma, and then the deposition gas is stopped.

Preferably, the polymer sidewall shaping phase (step 308) uses a profile shaping gas different from the deposition gas and comprising at least one of $C_xF_y$ and $NF_3$. More preferably, the profile shaping gas further comprises a carrier gas, such as argon or xenon. More preferably, the profile shaping gas further comprises at least one of an oxidizing additive and a reducing additive, such as $O_2$, $H_2$, $N_2$, or $NH_3$.

An example of the polymer sidewall shaping phase (step 308) provides a halogen containing gas, such as 100 sccm $CF_4$. In this example, $CF_4$ is the only gas provided during the profile shaping. A pressure of 20 mTorr is provided to the chamber. The second RF source 448 provides 600 Watts at a frequency of 27 MHz and 0 Watts at a frequency of 2 MHz. During the polymer sidewall shaping phase, the profile shaping gas is provided, the profile shaping gas is transformed into a plasma, and then the profile shaping gas is stopped.

Preferably, the process is performed between 2 to 20 cycles. More preferably, the process is performed between 3 to 10 cycles. The combination of deposition and polymer shaping over a plurality of cycles allows for the formation of vertical sidewalls. Preferably, the vertical sidewalls are sidewalls that from bottom to top make an angle between 88° to 90° with the bottom of the polymer layer.

Figure 2E:
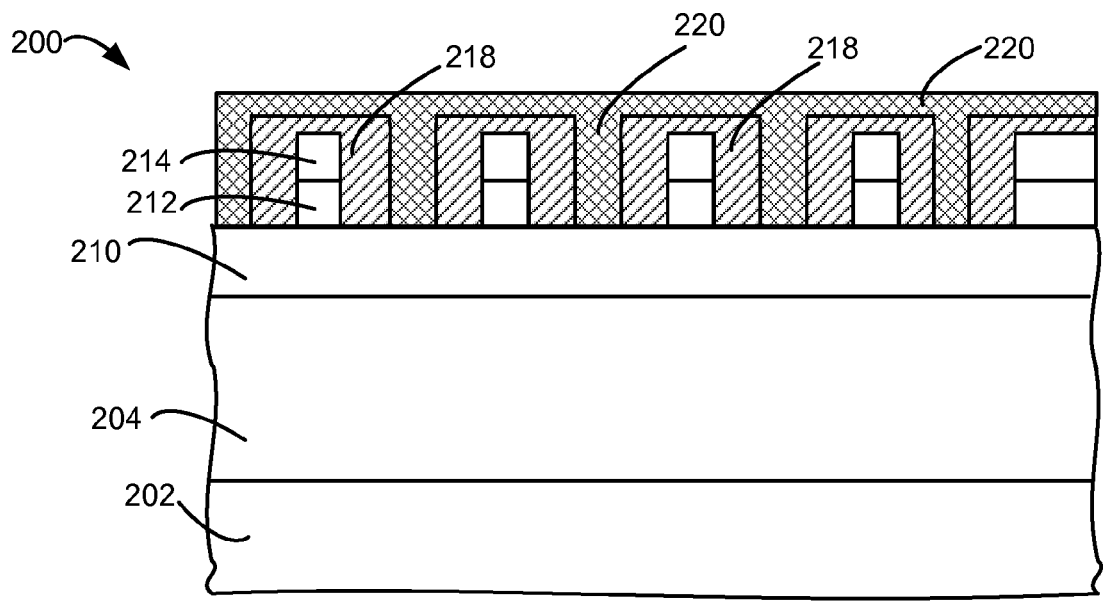

Referring back to FIG. 1, a silicon-containing film may be deposited over the polymer (step 118), as illustrated in FIG. 2E. The deposition may be in-situ or ex-situ. The silicon-containing film 220 may be any type of material, such as SOG, or Si-containing polymers, that is able to fill the features 216a, 216b and be planarized. In one embodiment, the silicon-containing film 220 may be the same material and/or has the same properties as the silicon-containing mask layer 212. The silicon-containing film 220 may be deposited at a temperature less than 100° C.

Figure 2F:
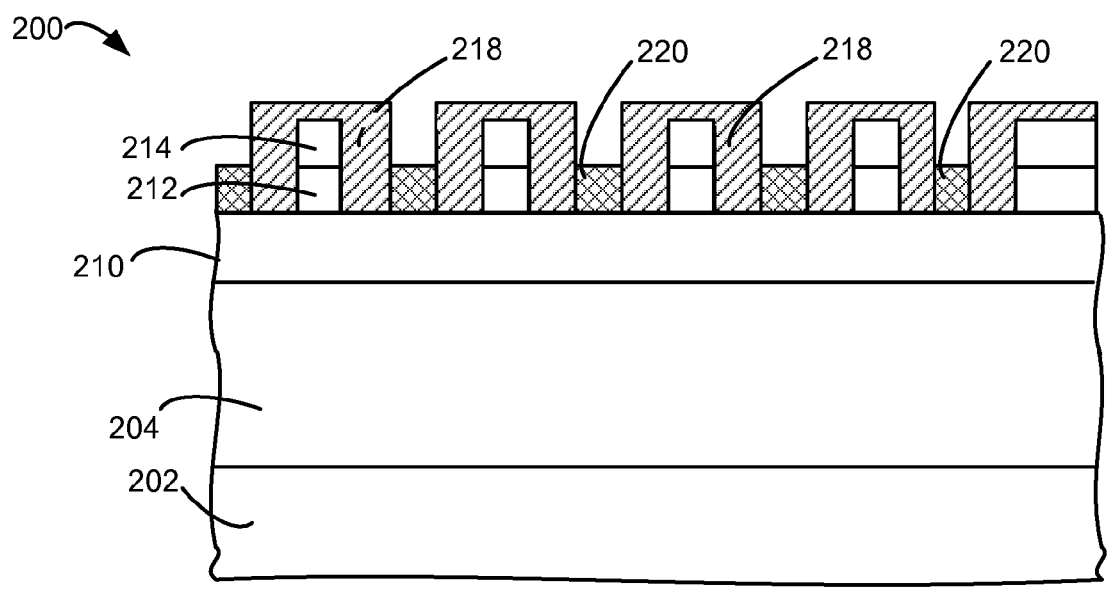

The silicon-containing film may then be planarized (step 120), as illustrated in FIG. 2F. The silicon-containing film 220 may be planarized using any known process, such as an etched back process or chemical mechanical polishing or wet etching.

Figure 2G:
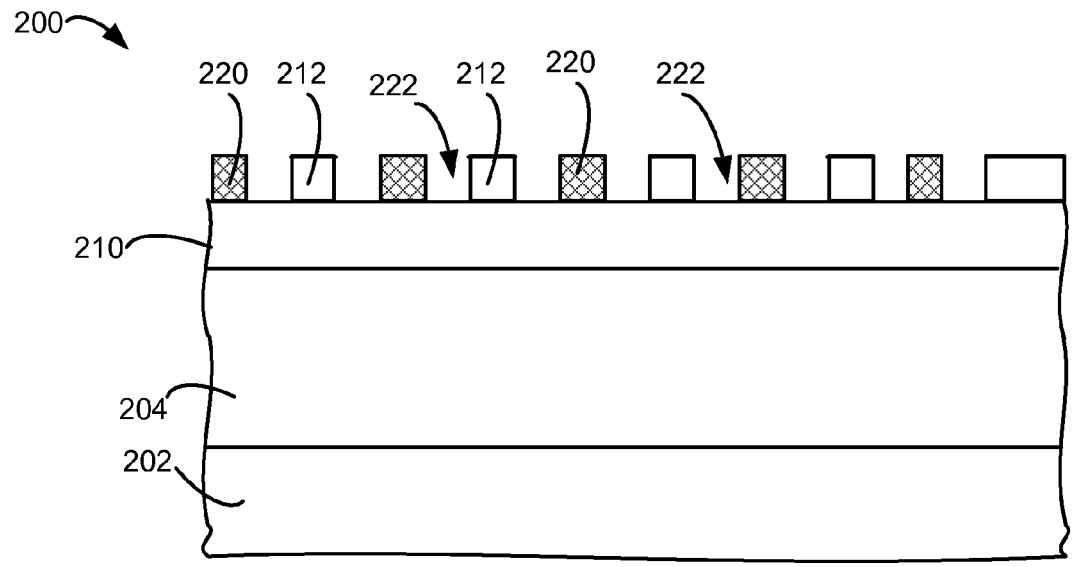

The polymer and patterned mask layer may then be selectively removed (step 122), as shown in FIG. 2G. The selective removal of the polymer results in gaps or features 222 that are formed where the polymer was removed. Thus, additional features are formed with smaller CD from the same patterned mask layer 214 and having sidewalls that are not jagged.

The polymer 218 and patterned mask 214 may be removed by an ashing step using an oxygen ashing that preferably does not undercut the silicon-containing film 220. The polymer 218 and patterned mask 214 may also be removed in a wet solution that is non-reactive towards the silicon-containing film 220.

Figure 2H:
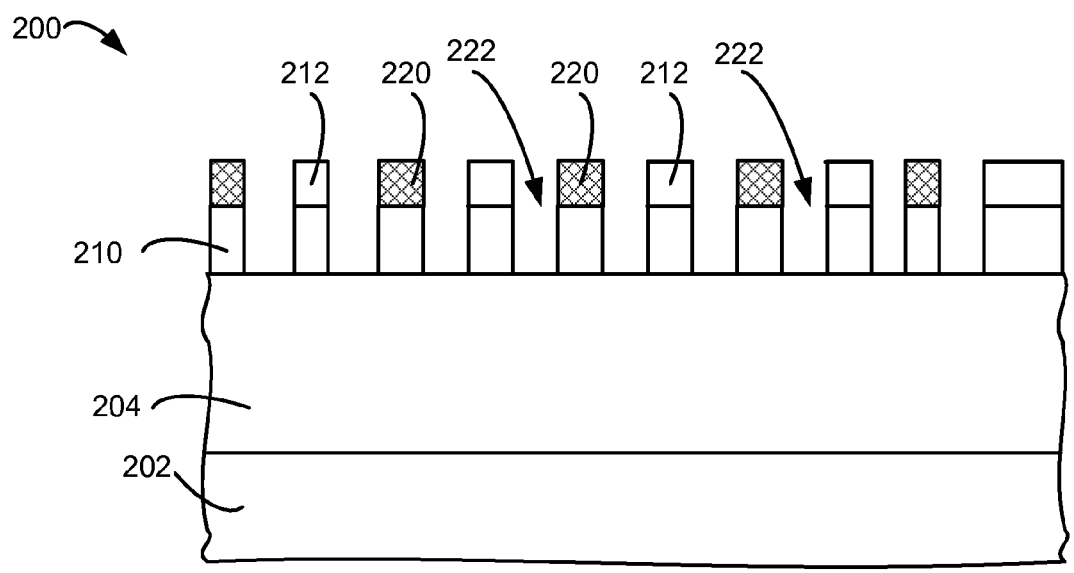
Figure 2I:
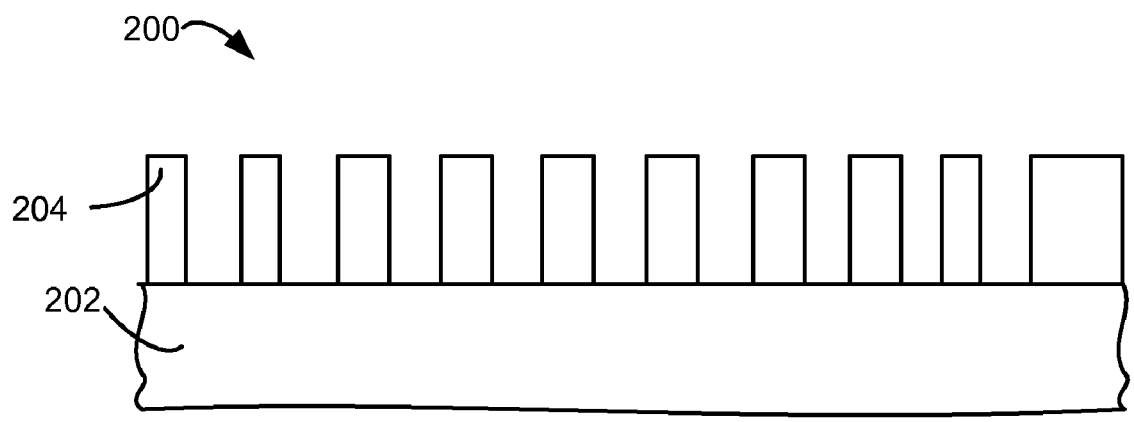

Referring back to FIG. 1, features are then etched in the organic layer (step 124), as illustrated in FIG. 2H. The organic layer 210 may be etched using known etching techniques. An example recipe may be that a pressure of 20 mTorr and 400 W at a frequency of 27 MHz is provided to the chamber. 100 sccm of $O_2$ and 5 sccm of $CH_3F$ is provided. The features may then be etched in the etched layer and the remaining mask layers may be removed (step 128), as shown in FIG. 2I. A conventional etch recipe for etching the etcher layer 204 may be used, for example, a pressure of 40 mTorr is provided to the chamber. An RF source provides 1000 W at a frequency of 60 MHz and 1000 W at a frequency of 2 MHz. 15 sccm of $C_4F_8$ and 10 sccm of $O_2$ are provided.

Additional steps may be provided to complete the formation of semiconductor devices. This process provides etched features with half the CD and double the features formed using the same photoresist mask using a conventional etch process.

Some of the steps in the above preferred embodiment may be omitted or changed without increasing CD. Other steps in the preferred embodiment may be omitted or changed, providing an embodiment that still reduces the CD and/or increase the number of features. For example, as discussed above, the patterned mask need not be trimmed after being etched.

Figure 6:
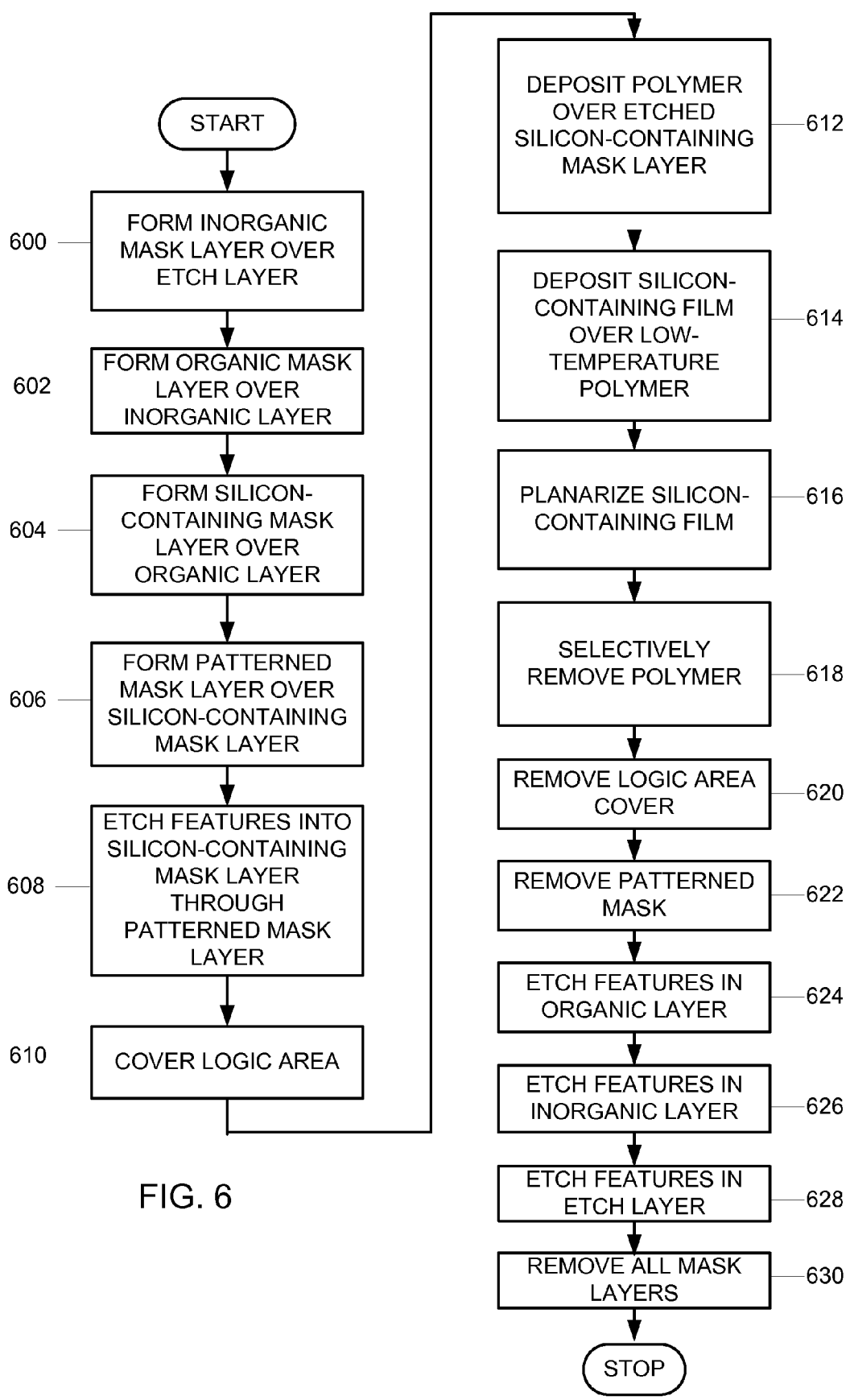
FIG. 6 is a flow chart of another exemplary embodiment of the invention.

FIG. 6 is a flow chart of another exemplary embodiment. In this example, the patterned mask is for forming a memory array chip. In this exemplary embodiment, also illustrated in FIGS. 7A-7L, dotted line 714 divides a region for logic devices, such as a peripheral logic device pattern 716 and the remaining chip for an array or cell region 718. In this example, it is desirable to increase the density of the array or cell region, which provides repeatable features, without necessarily increasing the density of the logic or peripheral region.

Referring to FIG. 6, an inorganic mask layer may be formed over an etch layer (step 600), an organic mask layer may be formed over the inorganic layer (step 602), a silicon-containing mask layer may be formed over the organic layer (step 604), and a patterned mask layer may be formed over the silicon-containing mask layer (step 606). FIG. 7A is a cross-sectional view of an etch layer 704 over a substrate 702, such as a wafer. An inorganic mask layer 706 may be formed over the etch layer 704, an organic mask layer 708 may be formed over the inorganic mask layer 706, a silicon-containing mask layer 710 may be formed over the organic mask layer 708, a patterned mask layer 712, such as a photoresist mask, may be formed over the silicon-containing mask layer 710, thereby forming a stack 700. The inorganic mask layer 706 may be formed from any silicon source such as tetraethoxysilane (TEOS), a silicon oxide nitride, and the like. In one example, the inorganic mask layer 706 may be a 300 nm inorganic mask material.

Figure 7B:
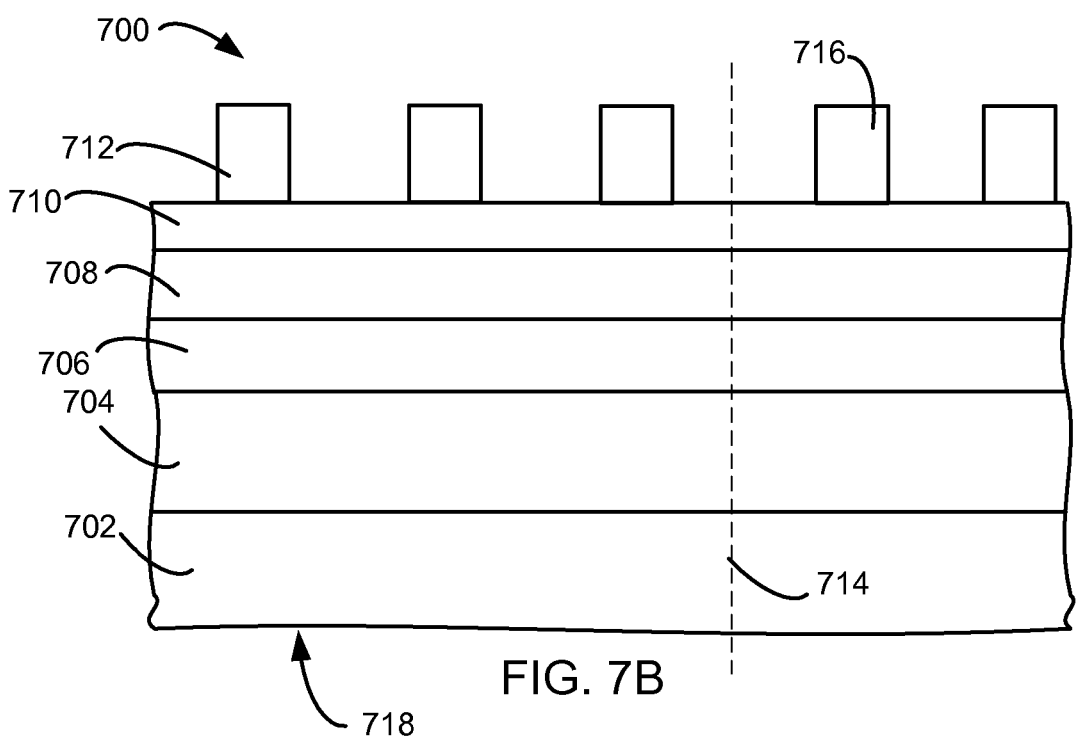
Figure 7C:
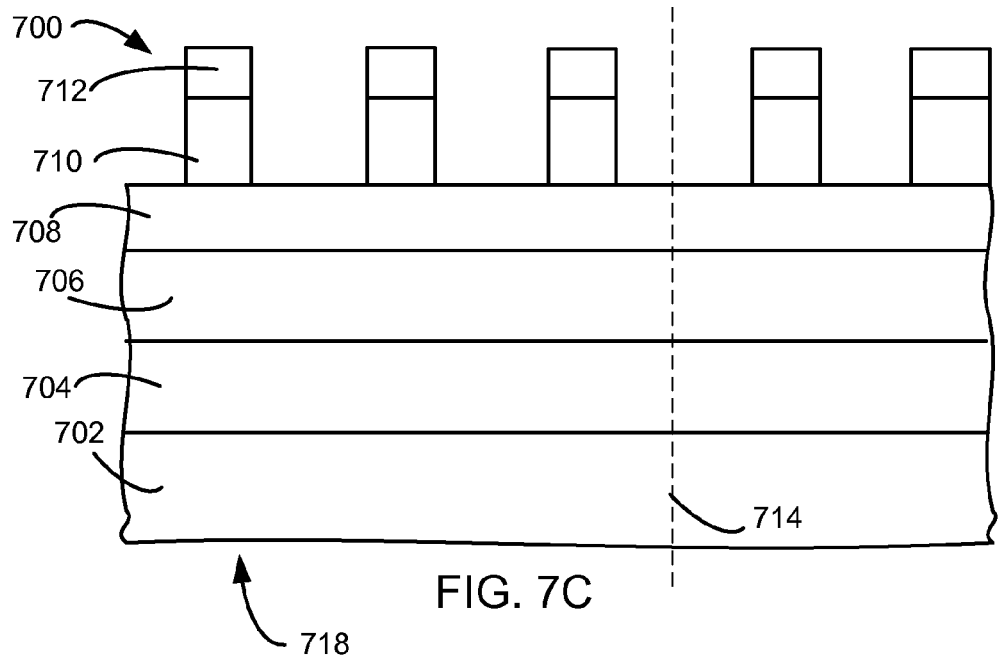

Although not illustrated in the flow chart of FIG. 6, the patterned mask 712 may be trimmed as illustrated in FIG. 7B. Features may be etched into the silicon-containing mask layer through the patterned mask layer (step 608), similar to the process described in the previous embodiment and as illustrated in FIG. 7C.

Figure 7D:
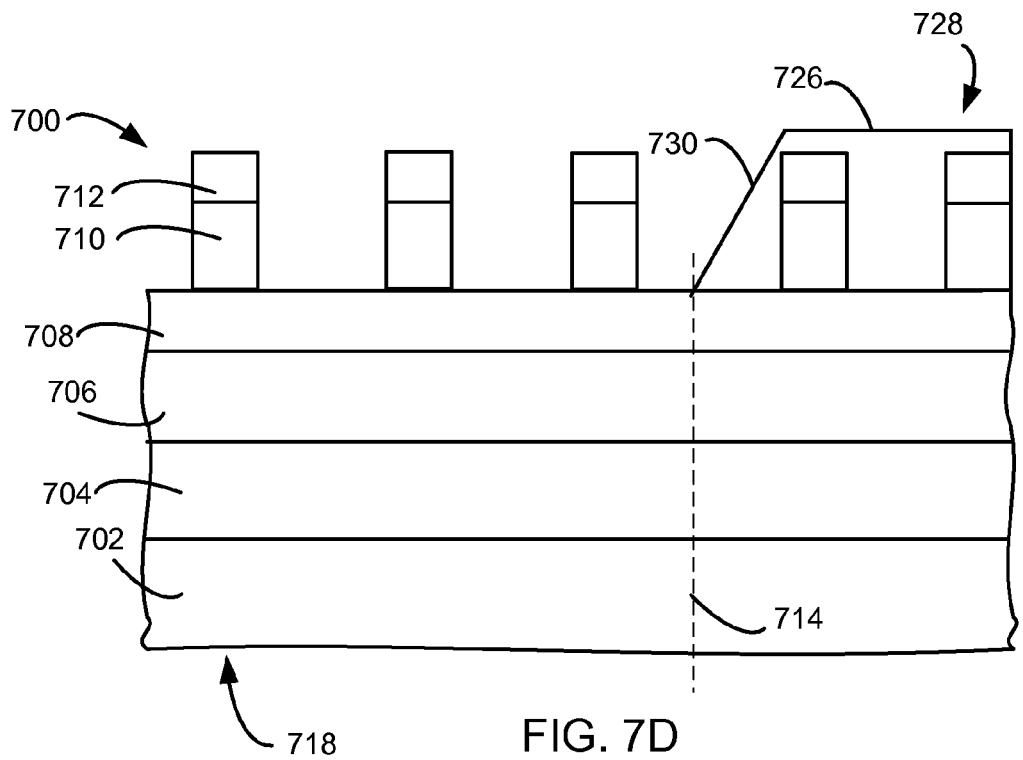

The logic area may be covered (step 610), as shown in FIG. 7D. A cover 726 may be formed over the logic area 728. In one example, an I-line photoresist may used to create the cover 726. This type of cover can be a low resolution cover. Preferably, the cover 726 has a sloping surface 730, instead of a vertical surface at the edge so that an undesirable spacer can not be formed in the subsequent processes along the edge of this cover 726.

Figure 7E:
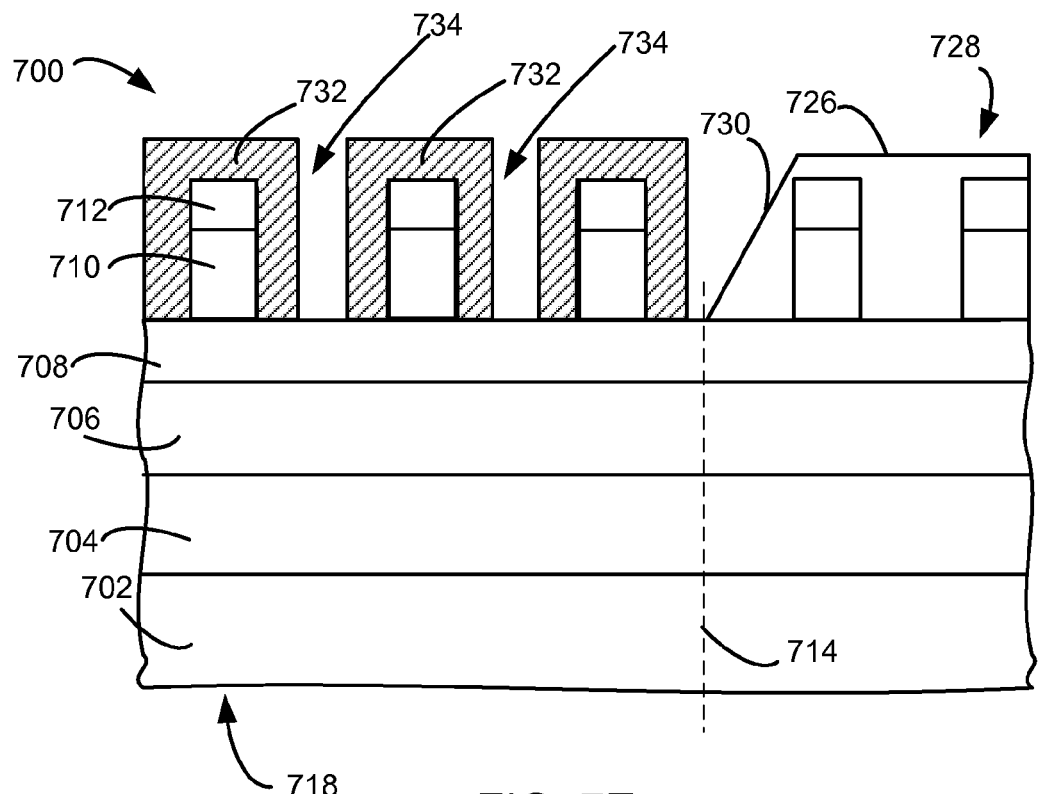

A polymer may be deposited over the silicon-containing mask layer (step 612). As illustrated in FIG. 7E, the polymer 732 deposition time may be adjusted such that the features 734 are not completely filled with the polymer 732. Preferably, the polymer 732 may only be deposited on the sidewalls of the silicon-containing mask layer 710 and the patterned mask layer 712 and not on the bottom of the features 734 as illustrated in FIG. 7E.

The polymer 732 may be any low temperature polymer as discussed above in the previous embodiment and may be conformally deposited using gas modulation (providing a deposition phase and a profile shaping phase) as discussed above.

Figure 7F:
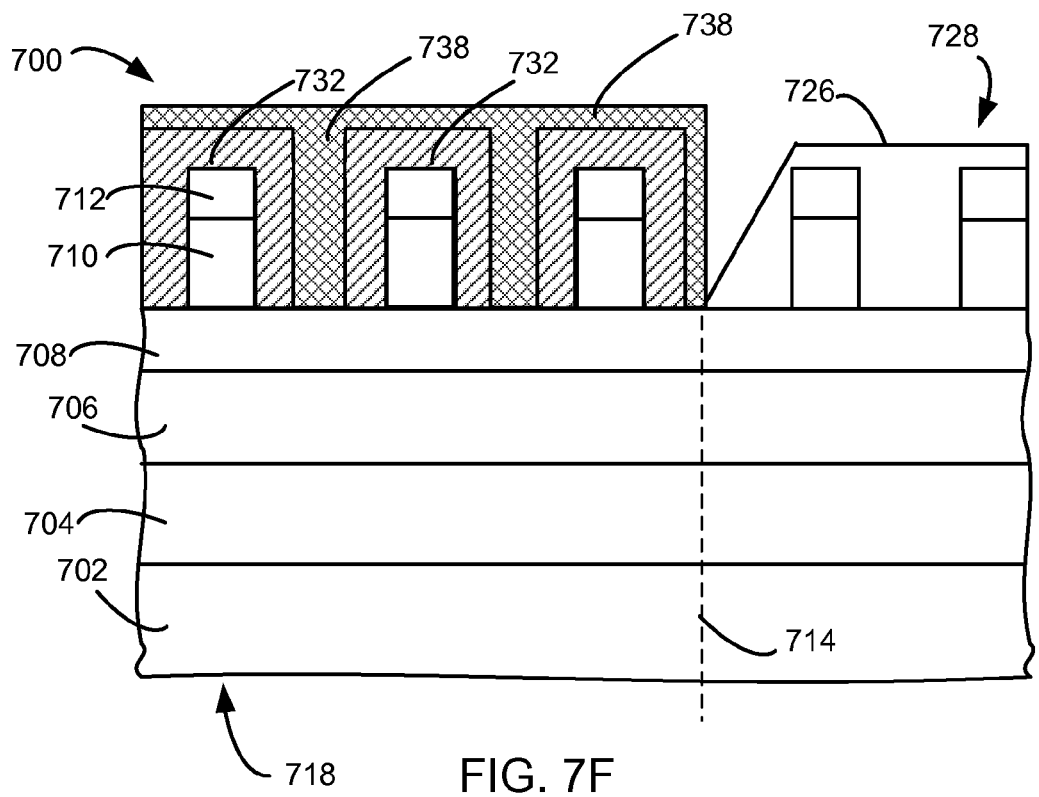

Referring back to FIG. 6, a silicon-containing film may be deposited over the polymer (step 614), as illustrated in FIG. 7F. The deposition may be in-situ or ex-situ and the silicon-containing film 738 may be any type of low temperature silicon-containing material, as discussed above. The silicon-containing film 738 may be deposited at a temperature less than 100° C. using a SOG process.

Figure 7G:
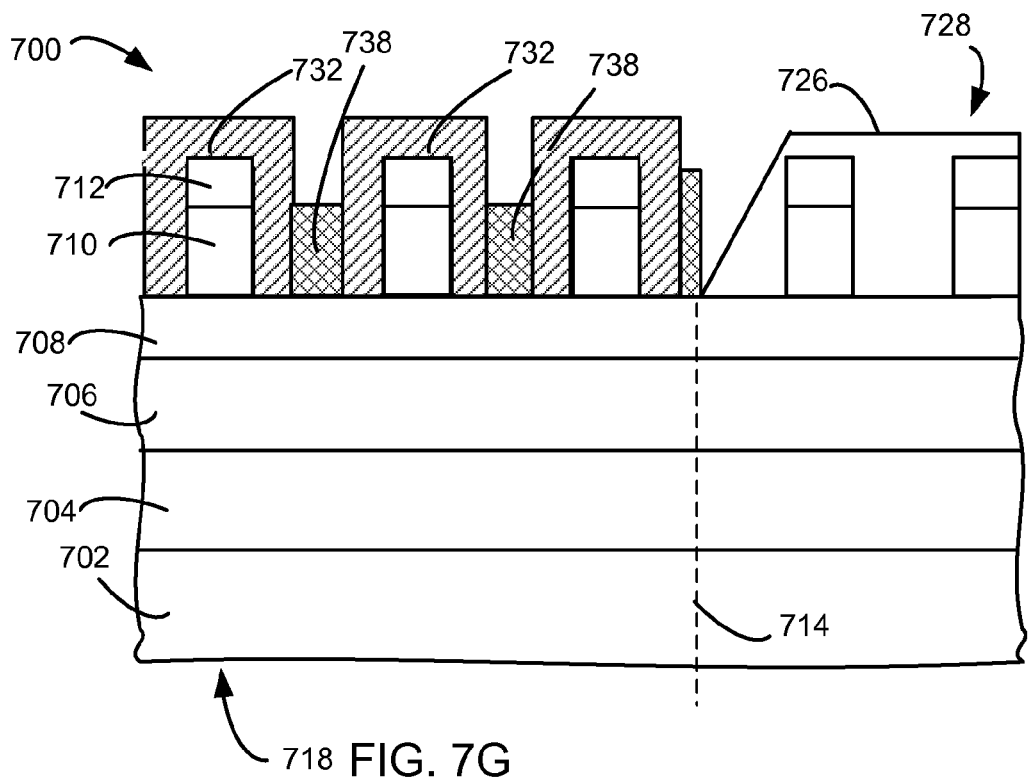

The silicon-containing film may then be planarized (step 616), as illustrated in FIG. 7G. The silicon-containing film 738 may be planarized using any known process, such as an etched back process or chemical mechanical polishing.

Figure 7H:
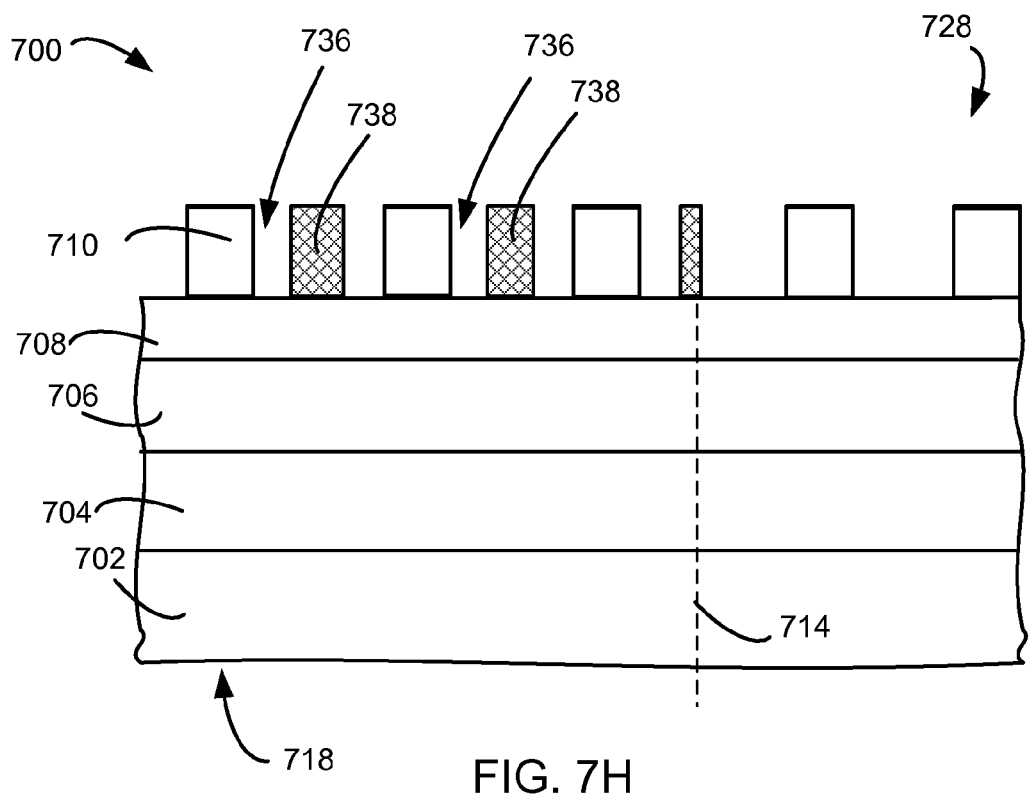

The polymer may then be selectively removed (step 618), as shown in FIG. 7H. The selective removal of the polymer 732 results in gaps or features 736 that are formed where the polymer was removed. Thus, additional features are formed with smaller CD from the same patterned mask layer 712 and having sidewalls that are straight and not jagged. The polymer 732 may be removed by the processes discussed in the previous embodiment.

Figure 7I:
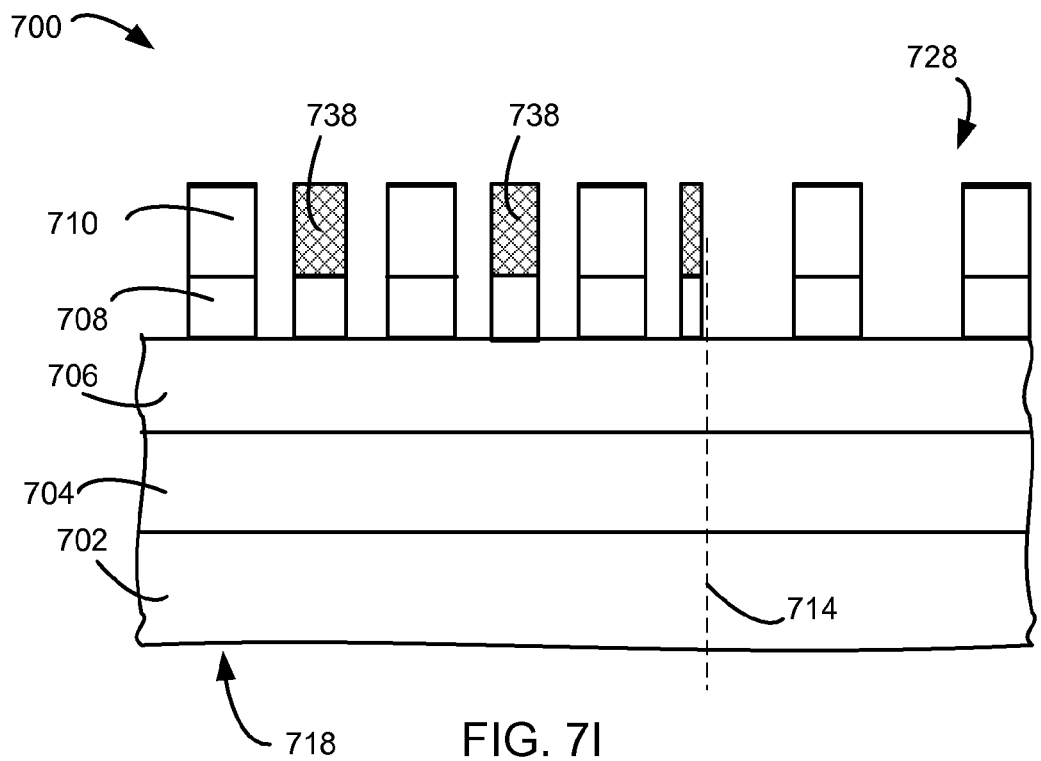
Figure 7J:
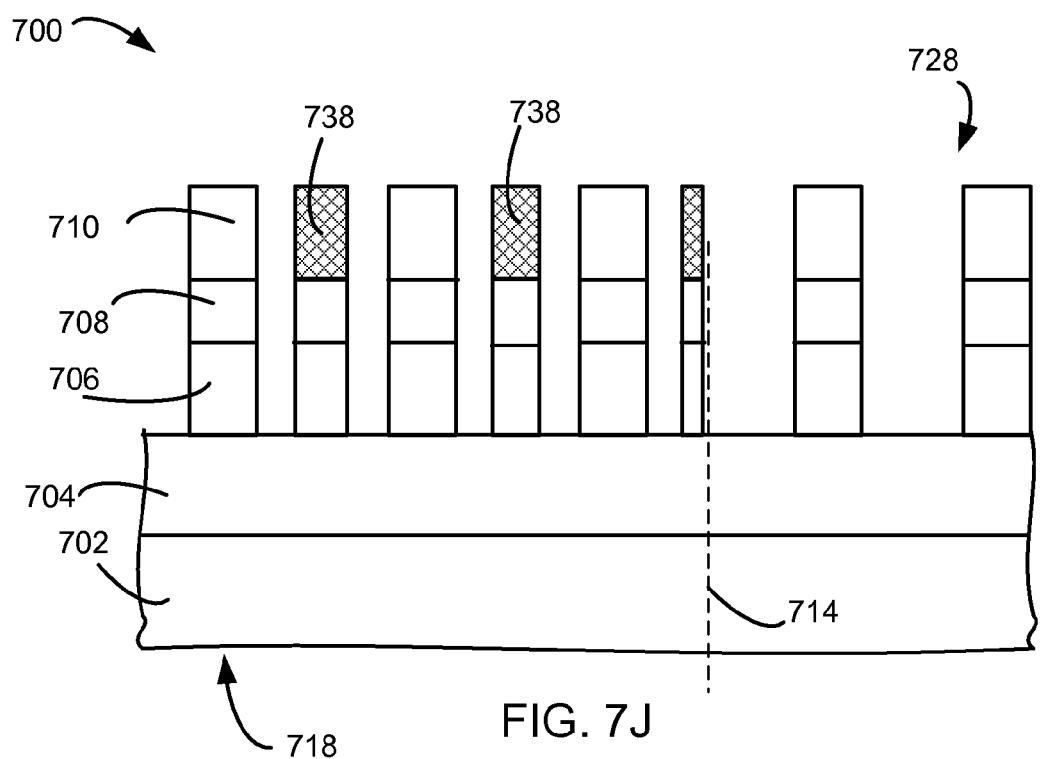
Figure 7K:
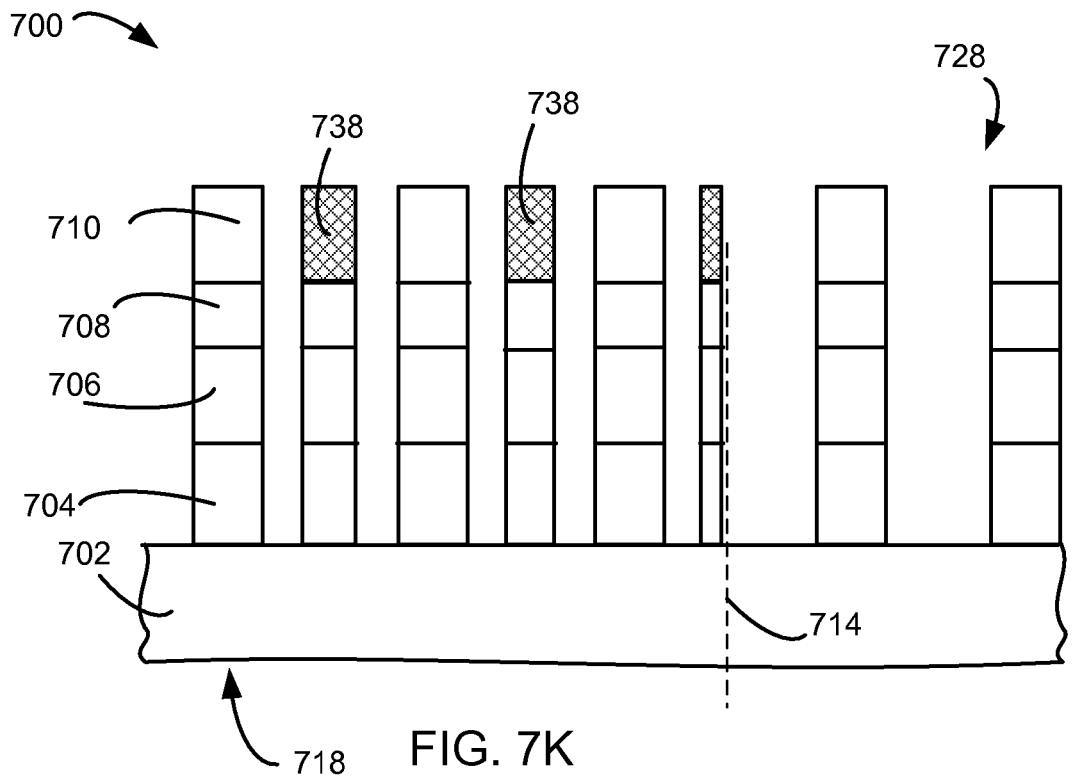
Figure 7L:
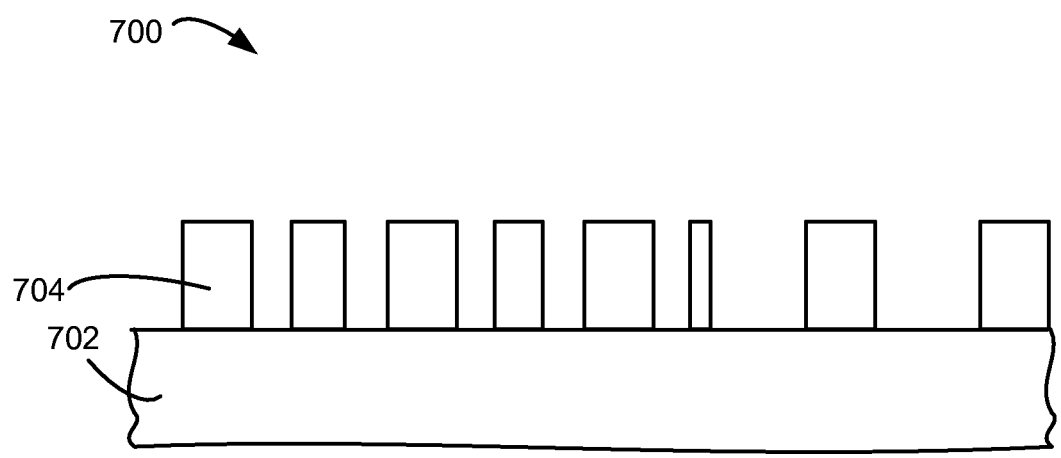

The cover may be removed (step 620) as well as the patterned mask layer (step 622), as shown in FIG. 7H. Features may then be etched in the organic layer (step 624) and inorganic layer (step 626), as illustrated in FIGS. 7I and 7J, respectively. The organic layer 708 and inorganic layer 706 may also be etched using known etching techniques as discussed in the above embodiment. For example, a recipe to etch the inorganic layer 706 may be that a pressure of 40 mTorr is provided to the chamber. An RF source provides 200 W at a frequency of 27 MHz. 100 sccm of $CF_4$ is provided. The features may then be etched in the etched layer (step 628) and all mask layers removed (step 630), as shown in FIGS. 7K and 7L, respectively.

While this invention has been described in terms of several preferred embodiments, there are alterations, modifications, permutations, and various substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and various substitute equivalents as fall within the true spirit and scope of the present invention.

What is claimed is:

1. A method for patterning features over an etch layer, comprising:
   forming an organic mask layer over the etch layer;
   forming a silicon-containing mask layer over the organic mask layer;
   forming a patterned mask layer over the silicon-containing mask layer;
   etching the silicon-containing mask layer through the patterned mask layer;
   depositing a polymer over the etched silicon-containing mask layer, wherein the depositing a polymer comprises at least two cycles of a sidewall formation process, wherein each cycle comprises:
   a polymer deposition phase; and
   a polymer sidewall shaping phase;
   depositing a silicon-containing film over the polymer;
   planarizing the silicon-containing film;
   selectively removing the polymer leaving the silicon-containing film; and
   etching the organic mask layer.

2. The method of claim 1, further comprising etching the etch layer.

3. The method of claim 2, further comprising removing the organic mask layer, the silicon-containing mask layer, and the patterned mask layer.

4. The method of claim 3, wherein the polymer deposition phase comprises:
   providing a polymer deposition gas;
   forming a plasma from the deposition gas; and
   stopping the flow of the deposition gas,
   wherein a temperature is less than 100° C.

5. The method of claim 4, wherein the polymer sidewall shaping phase comprises:

providing a profile shaping gas different than the deposition gas;
forming a plasma from the profile shaping gas; and
stopping the flow of the profile shaping gas,
wherein a temperature is less than 100° C.

6. The method of claim 5, wherein the polymer is a low temperature polymer.

7. The method of claim 6, wherein the silicon-containing film is a low temperature silicon material.

8. The method of claim 7, wherein the depositing a silicon-containing film further comprises a SOG process, wherein the temperature is less than 100° C.

9. The method of claim 8, wherein the patterned mask layer is a photoresist mask, and wherein the forming a patterned mask layer further comprises:
trimming the patterned features in the photoresist mask.

10. The method of claim 9, further comprising:
forming an anti-reflective coating (ARC) layer over the silicon-containing mask layer.

11. The method of claim 10, wherein the silicon-containing film and the silicon-containing mask layer are a spin on glass film.

12. The method of claim 1, further comprising removing the organic mask layer, the silicon-containing mask layer, and the patterned mask layer.

13. The method of claim 1, wherein the polymer deposition phase comprises:
providing a polymer deposition gas;
forming a plasma from the deposition gas; and
stopping the flow of the deposition gas,
wherein a temperature is less than 100° C.

14. The method of claim 13, wherein the polymer sidewall shaping phase comprises:
providing a profile shaping gas different than the deposition gas;
forming a plasma from the profile shaping gas; and
stopping the flow of the profile shaping gas,
wherein a temperature is less than 100° C.

15. The method of claim 1, wherein the polymer is a low temperature polymer.

16. The method of claim 1, wherein the silicon-containing film is a low temperature silicon material.

17. A method for patterning features over an etch layer, comprising:
forming an organic mask layer over the etch layer;
forming a silicon-containing mask layer over the organic mask layer;
forming a patterned mask layer over the silicon-containing mask layer;
etching the silicon-containing mask layer through the patterned photo-resist mask;
depositing a polymer over the etched silicon-containing mask layer, wherein the depositing a polymer comprises at least two cycles of a sidewall formation process, wherein each cycle comprises:
a polymer deposition phase, wherein the polymer deposition phase comprises:
providing a polymer deposition gas;
forming a plasma from the deposition gas, while maintaining a temperature of less than 100° C.; and
stopping the flow of the deposition gas; and
a polymer sidewall shaping phase, wherein the polymer sidewall shaping phase comprises:
providing a profile shaping gas different than the deposition gas;
forming a plasma from the profile shaping gas, while maintaining a temperature of less than 100° C.; and
stopping the flow of the profile shaping gas;
depositing a silicon-containing film over the polymer;
planarizing the silicon-containing film;
selectively removing the polymer leaving the silicon-containing film;
etching the organic layer; and
etching the etch layer.

18. The method, as recited in claim 1, wherein the deposited polymer does not cover bottoms of features of the silicon-containing mask layer.

* * * * *